(12) United States Patent
Liu (10) Patent No.: US 9,648,783 B1
(45) Date of Patent: May 9, 2017

(54) ENHANCED HEAT DISSIPATION MODULE HAVING MULTI-LAYER HEAT ISOLATION

(71) Applicant: EBN Technology Corp., New Taipei (TW)

(72) Inventor: Tze Yang Liu, New Taipei (TW)

(73) Assignee: EBN TECHNOLOGY CORP., New Taipei (TW)

( * ) Notice: Subject to any disclaimer, the term of this patent is extended or adjusted under 35 U.S.C. 154(b) by 0 days.

(21) Appl. No.: 15/053,527

(22) Filed: Feb. 25, 2016

(51) Int. Cl.
*H05K 9/00* (2006.01)
*G06F 1/20* (2006.01)
*H05K 7/20* (2006.01)
*H05K 1/02* (2006.01)
*H01L 23/367* (2006.01)
*H01L 23/373* (2006.01)
*H05K 5/04* (2006.01)
*H01L 23/427* (2006.01)

(52) U.S. Cl.
CPC ........... *H05K 7/20509* (2013.01); *G06F 1/20* (2013.01); *H01L 23/3672* (2013.01); *H01L 23/3675* (2013.01); *H01L 23/3736* (2013.01); *H01L 23/427* (2013.01); *H05K 1/021* (2013.01); *H05K 5/04* (2013.01); *H05K 7/20336* (2013.01); *H05K 7/20436* (2013.01); *H05K 9/0088* (2013.01)

(58) Field of Classification Search
CPC ....... H01L 2224/32225; H01L 2224/97; H01L 2924/3025; H01L 23/3675; H01L 23/3672; H01L 23/427; H01L 23/3736; G06F 1/20; G06F 1/206; H05K 1/0203; H05K 2201/066; H05K 7/20154; H05K 7/20336; H05K 9/0088; H05K 9/0026; H05K 9/0073; H05K 2201/10371; H05K 7/20509; H05K 1/021; H05K 7/20436; H05K 5/04
See application file for complete search history.

(56) References Cited

U.S. PATENT DOCUMENTS

| 6,191,946 B1 * | 2/2001 | Yu ........................ H01L 21/4882 165/80.2 |
| 6,914,780 B1 * | 7/2005 | Shanker .............. F28D 15/0233 165/104.33 |
| 7,336,490 B2 * | 2/2008 | Harris ................... H01L 23/433 165/121 |
| 2007/0133174 A1 * | 6/2007 | Mikami .................. G06F 1/203 361/700 |

(Continued)

*Primary Examiner* — Adam B Dravininkas
(74) *Attorney, Agent, or Firm* — Chun-Ming Shih (57) ABSTRACT

An enhanced heat dissipation module having multi-layer heat isolation, made of copper, aluminum, iron, or a combination thereof, includes a protection box, used to receive an electric circuit board. On protection box is provided with at least a notch corresponding to high heat generating electronic components on the electric circuit board. A heat dissipater is provided with a large heat dissipation area disposed opposite to protection box, and it includes at least a fix seat disposed in protrusion on the heat dissipater. The fix seat extends into the notch of the protection box, to contact fully surface of the high heat generating electronic components. An elastic contact plate, disposed in front of the fix seat, to press against surface of the high heat generating electronic components. A plurality of heat conduction tubes are pressed onto the heat dissipater, with one end connected to the fix seat.

6 Claims, 5 Drawing Sheets

(56) References Cited

U.S. PATENT DOCUMENTS

| | | | | |
|---|---|---|---|---|
| 2007/0258218 A1* | 11/2007 | Peng | ............... | H01L 23/427 |
| | | | | 361/715 |
| 2009/0073655 A1* | 3/2009 | Takakusaki | ........... | G06F 1/1616 |
| | | | | 361/679.49 |
| 2009/0142956 A1* | 6/2009 | Ma | ................ | H01L 23/4006 |
| | | | | 439/485 |
| 2012/0193076 A1* | 8/2012 | Sakamoto | ............. | H01L 23/427 |
| | | | | 165/104.21 |
| 2014/0092559 A1* | 4/2014 | Yamaguchi | ........ | H05K 7/20336 |
| | | | | 361/700 |
| 2014/0247559 A1* | 9/2014 | Wu | ................... | H05K 7/20509 |
| | | | | 361/704 |

* cited by examiner

ENHANCED HEAT DISSIPATION MODULE HAVING MULTI-LAYER HEAT ISOLATION

BACKGROUND OF THE INVENTION

Field of the Invention

The present invention relates to an enhanced heat dissipation module having multi-layer heat isolation, and in particular to an enhanced heat dissipation module having multi-layer heat isolation, that is characterized in having tight contact and low thermal resistance, large contact area enhancing heat dissipation, and multi-layer heat isolation protection on heat transmission path to the electrical circuit board. Further, it is provided with elastic metal support to prevent deformation of the electrical circuit board, in achieving high reliability, increased MTBF (Mean Time Between Failure) and MTTF (Mean Time To Failure) for the electrical circuit board.

The Prior Arts

In recent years, due to rapid progress and development of computer and information industries, the functions of electronic devices making use of Integrated Circuit (IC) are enhanced significantly. As such, the computation speed of the electronic devices has been rapidly increased, yet the ensuing heat generated is also increased. By way of an example, in case the heat dissipation of a Central Processing Unit (CPU) is not sufficient, then it tends to burn out due to high temperature. Or, even if it is not burned out, yet the heat it generates will cause over heating of other electronic components around, thus adversely affecting their functions, performance and even specifications. Presently, there are quite a lot of heat dissipation solutions for CPU, however the matching solutions are lacking for preventing other electronic components from being aged by CPU heat dissipated, and that has yet to be developed.

In addition, the electronic devices utilized in the Industries are quite different from the consumer electronic devices, they are required to have high reliability and sufficiently long MTBF (Mean Time Between Failure) and MTTF (Mean Time To Failure). In order to meet this demand, the electronic devices utilized in the Industries adopt a "fan-less" heat dissipation solution, rather than taking a moving part approach using fans or hard disk. However, the side effects of the deformation of the electronic circuit board, and shortening of electronic component MTBF (Mean Time Between Failure) and MTTF (Mean Time To Failure) have always been serious concerns for system design in the Industries, and that have been treated as design limitations and not really been solved effectively.

Figure 5:
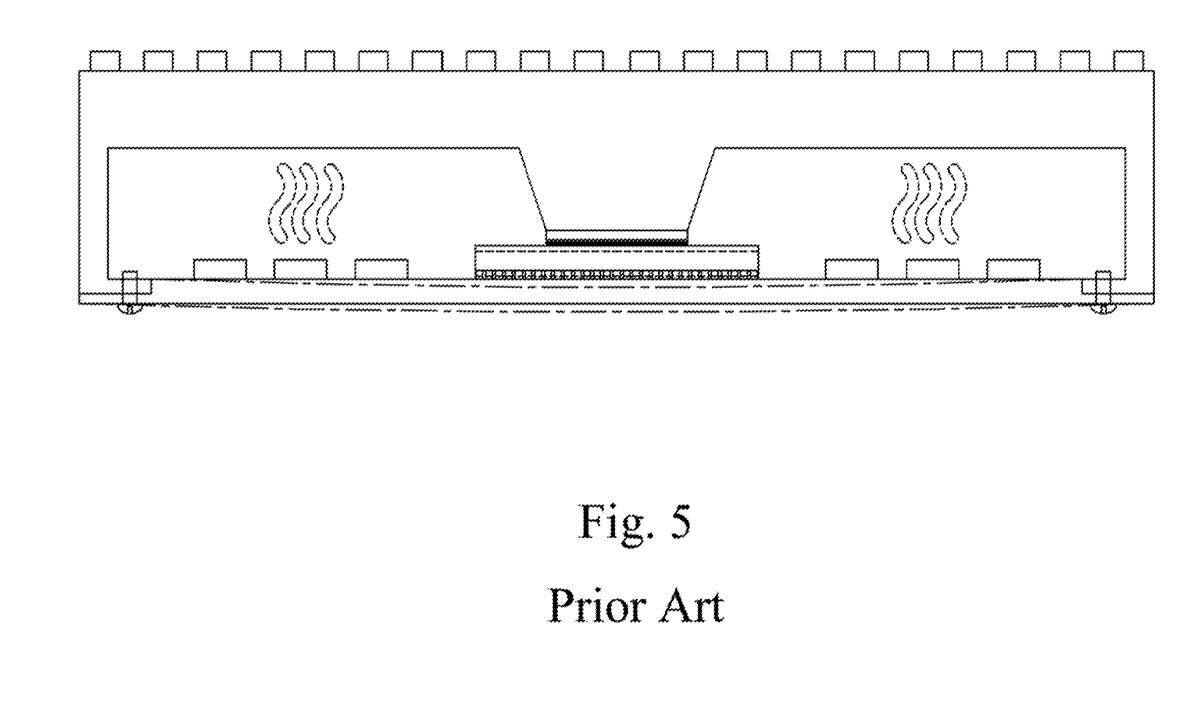
FIG. 5 is a plane view of a conduction type heat dissipation structure according to the Prior Art.

In this respect, refer to FIG. 5 for a plane view of a conduction type heat dissipation structure according to the Prior Art. As shown in FIG. 5, in such a structure, the contact surface of the metal heat conduction plate is pressed against the heat generation surface of CPU, and that is used in combination with a heat pipe to connect to a metal shell (or heat dissipation plate) of high thermal conductivity, to transfer the high heat generated by CPU to a metal shell, to achieve heat dissipation through heat exchange with cold air. However, when the heat generated by CPU is transferred to the metal shell, the metal shell (or heat dissipation plate) replaces CPU to become a new heat source. At this time, due to heat convection (as shown FIG. 5) between this new heat source and other electronic components on the electric circuit board, the MTBF (Mean Time Between Failure) and MTTF (Mean Time To Failure) of those electronic components tend to reduce to half for every increase of 10° C., thus decreasing their system reliability.

Moreover, in order to ensure tight and compact assembly between high heat generation components and metal heat dissipation structure, in assembly, certain amount of stress is designed to be applied on the electric circuit board near CPU, such that the contact surface of the metal heat conduction plate is pressed effectively against the heat generation surface of CPU, to ensure optimal heat dissipation. However, due to the pressure applied, the electric circuit board tends to deform after long period of usage (as shown in dashed line portion of FIG. 5), such that stress is produced inside the soldering tin between the SMD (surface mounted device) components (for example CPU) and the electric circuit board. Even worse, the solder balls between CPU die and CPU substrate tend to crack for subjecting to internal stress for long period of time, thus leading to the unstable connection or even failure of the entire system due to poor contact. Meanwhile, the deformation of the electric circuit board will create contact gaps and the ensuing poor heat dissipation, such that high temperature persists to cause damage to the electric components around, to adversely affect its performance, MTBF (Mean Time Between Failure), and MTTF (Mean Time To Failure).

Therefore, presently, the design and performance of heat dissipation structure is not quite satisfactory, and it leaves much room for improvement.

SUMMARY OF THE INVENTION

In view of the problems and drawbacks of the prior art, the present invention provides an enhanced heat dissipation module having multi-layer heat isolation, to effectively overcome the shortcomings of the prior art.

A major objective of the present invention is to provide an enhanced heat dissipation module having multi-layer heat isolation, made of copper, aluminum, iron, or a combination thereof, including: a protection box, a heat dissipater, an elastic contact plate, and a plurality of heat conduction tubes.

In the structure mentioned above, the protection box is used to receive an electric circuit board, on the protection box is provided with at least a notch corresponding to high heat generating electronic components on the electric circuit board, while the high heat generating electronic components are one of the following group consisting of: a central processing unit (CPU), an image processing chip, a graphic processing chip, and high level integrated circuit (IC).

The heat dissipater is provided with a large heat dissipation area, disposed opposite to the protection box, and it includes at least a fix seat disposed in protrusion on the heat dissipater, the fix seat extends into the notch of the protection box, to contact fully with surface of the high heat generating electronic components.

The elastic contact plate is disposed in front of the fix seat, to press against the surface of the high heat generating electronic components.

The plurality of heat conduction tubes are pressed onto the heat dissipater, with its one end connected to the fix seat.

Through application of the enhanced heat dissipation module having multi-layer heat isolation, the following advantages can be achieved: tight contact and ensuing low thermal resistance, large contact area with air in achieving enhanced heat dissipation, multi-layer conduction medium and protection box in realizing heat isolation, and elastic metal support absorbing pressure exerted on the electric circuit board and preventing deformation of the electric circuit board, in achieving increased reliability, MTBF (Mean Time Between Failure), and MTTF (Mean Time To Failure) of electronic components on the electric circuit board.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from the detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Refer to FIGS. 1 to 4 respectively for a plane view of an enhanced heat dissipation module having multi-layer heat isolation according to a first embodiment of the present invention; a plane view of an enhanced heat dissipation module having multi-layer heat isolation according to a second embodiment of the present invention; a schematic diagram of an enhanced heat dissipation module having multi-layer heat isolation in application according to a first embodiment of the present invention; a schematic diagram showing multi-layer heat isolation between module and electronic circuit board for an enhanced heat dissipation module having multi-layer heat isolation according to the present invention; and a plane view of a conduction type heat dissipation structure according to the Prior Art.

As shown in FIGS. 1 to 4, the present invention provides an enhanced heat dissipation module having multi-layer heat isolation made of copper, aluminum, iron, or a combination thereof, including: a protection box 1, a heat dissipater 2, an elastic contact plate 4, and a plurality of heat conduction tubes 5.

In the structure mentioned above, the protection box 1 is used to receive an electric circuit board 9, on the protection box 1 is provided with at least a notch 11 corresponding to high heat generating electronic components 91 on the electric circuit board 9. The high heat generating electronic components 91 are one of the following group consisting of: a central processing unit (CPU), an image processing chip, a graphic processing chip, and a high level integrated circuit (IC), but the present invention is not limited to this.

Figure 1:
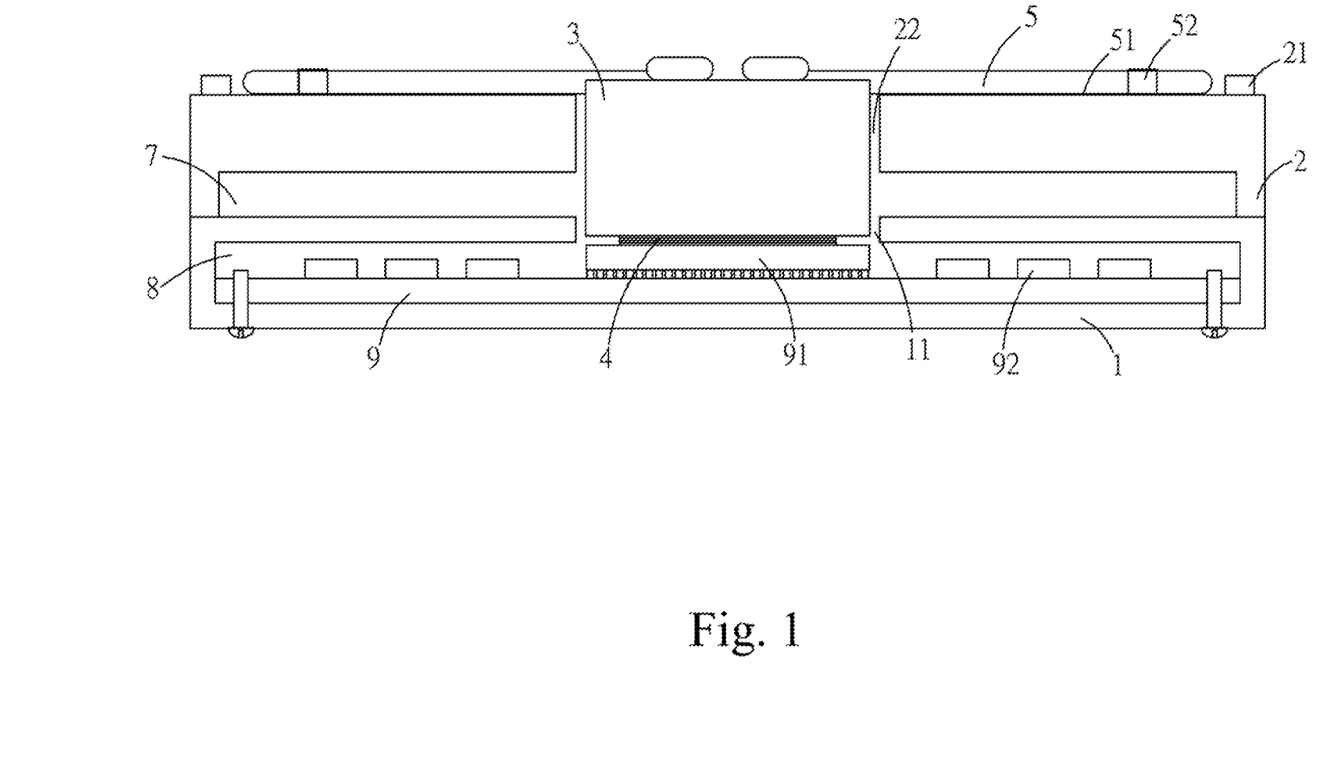
FIG. 1 is a plane view of an enhanced heat dissipation module having multi-layer heat isolation according to a first embodiment of the present invention.
Figure 2:
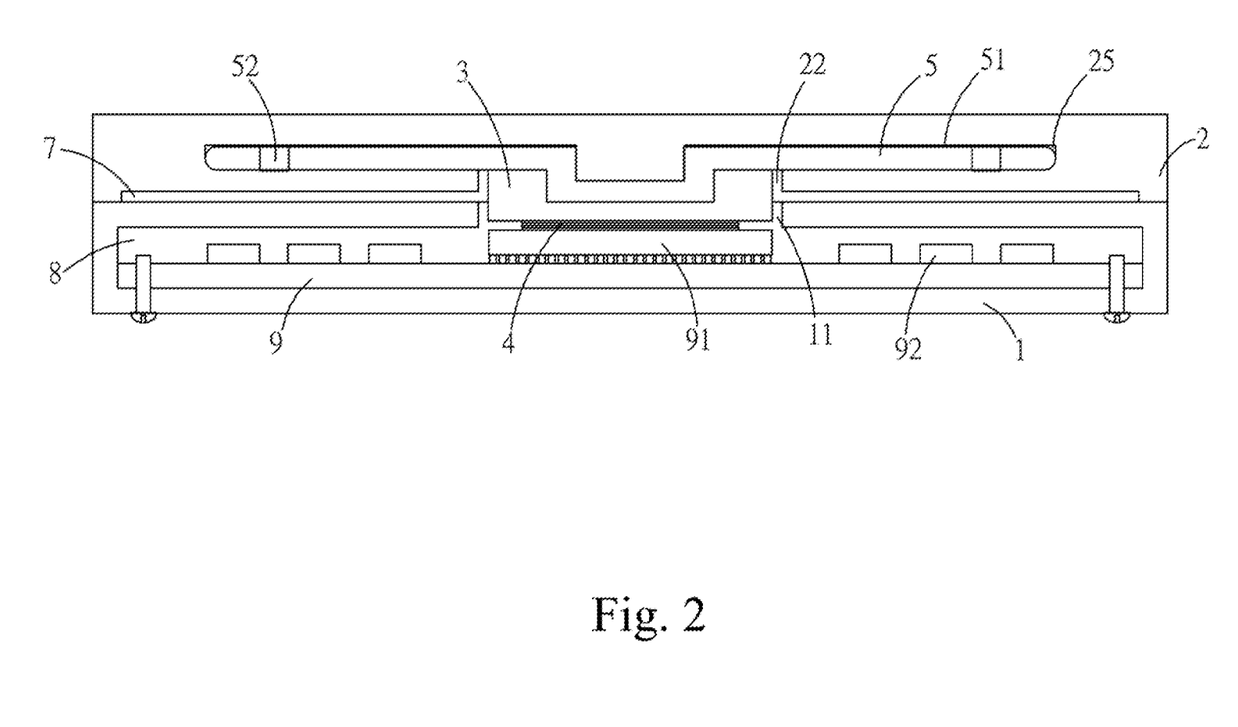
FIG. 2 is a plane view of an enhanced heat dissipation module having multi-layer heat isolation according to a second embodiment of the present invention.

The heat dissipater 2 is provided with a large heat dissipation area, disposed opposite to the protection box 1, and it includes at least a fix seat 3 disposed in protrusion on the heat dissipater 2. The fix seat 3 extends into the notch 11 of the protection box 1, to contact fully the surface of the high heat generating electronic components 91. The shape of the heat dissipater 2 is not particularly limited, it can be in a form of a planar shape (as shown in FIG. 2), or it can be in a form of a shell of an undercut shape (as shown in FIG. 1). On an outer side of the heat dissipater 2 is provided with heat dissipation fins 21, while on its opposite position is provided with a notch 22.

The elastic contact plate 4 is disposed in front of the fix seat 3, to press elastically against surface of the high heat generating electronic components 91.

The plurality of heat conduction tubes 5 are pressed onto the heat dissipater 2, with its one end connected to the fix seat 3.

In an embodiment of the present invention, the protection box 1 is made of iron, the heat dissipater 2 is a die casting piece made of aluminum, while the fix seat 3 and the elastic contact plate 4 are made of copper, but the present invention is not limited to this. The heat conduction tube 5 is made of a tight seal copper tube having volatile fluid contained therein. In manufacturing, the heat conduction tube 5 can be disposed on the inner side or the outer side of the heat dissipater 2. As shown in FIG. 2, the heat conduction tube 5 is of an inner side type, and a corresponding long slot 25 is provided on an inner side of the heat dissipater 2 for the heat conduction tube 5 having heat conduction glue 51 applied on its outer side to insert in, and then it is fixed by using a lock plate 52, while one end of the heat conduction tube 5 is connected to the fix seat 3. In the present embodiment, the notch 22 adopts back wall of real seal. As shown in FIG. 1, the heat conduction tube 5 is of an outer side type, and its installation is simple. Wherein, the heat conduction tube 5 having heat conduction glue 51 applied on its outer side can be fixed between the heat dissipation fins 21 by using a lock plate 52, and is pressed on the heat dissipater 2, while on end of the heat conduction tube 5 is connected to the fix seat 3 above the notch 22.

Figure 3:
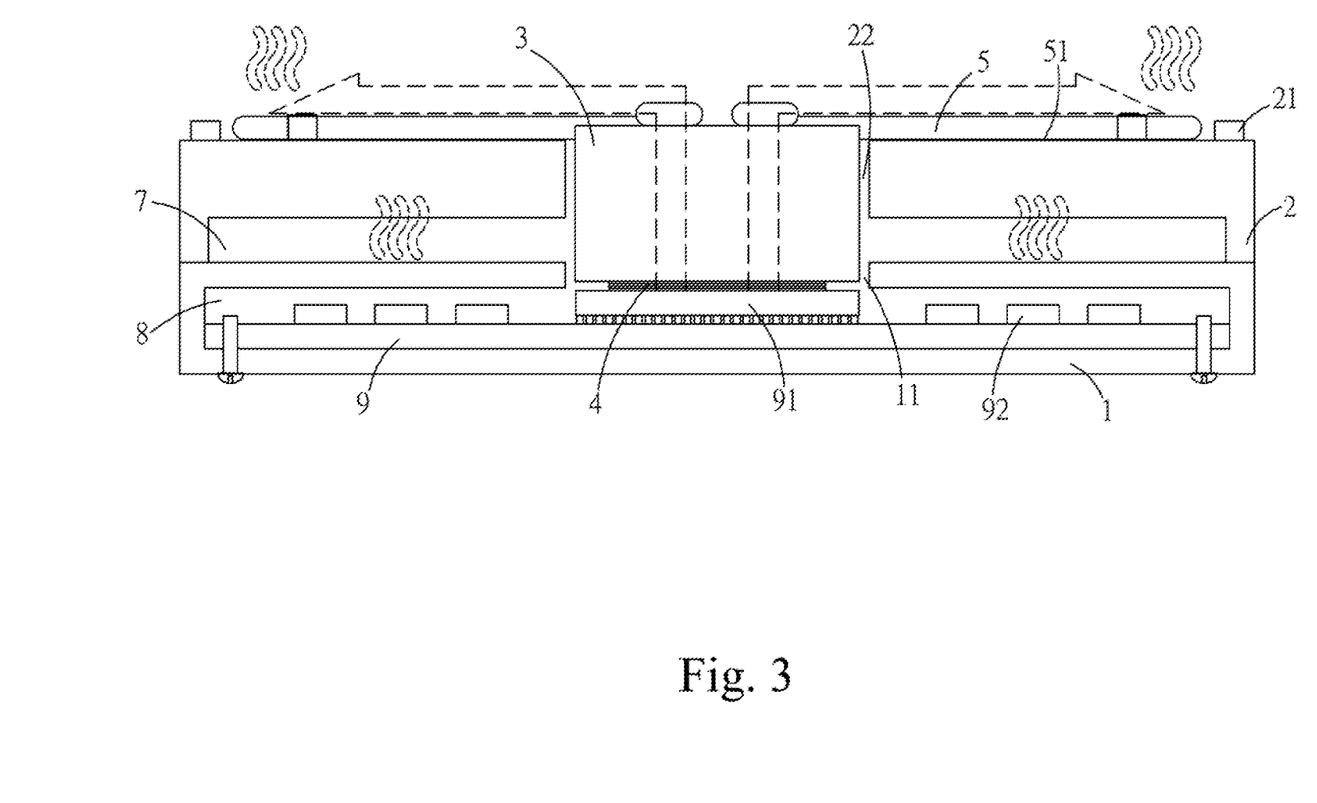
FIG. 3 is a schematic diagram of an enhanced heat dissipation module having multi-layer heat isolation in application according to a first embodiment of the present invention.

As shown in FIGS. 1 and 3, in which, the outer side type heat conduction tube 5 is taken as an example for explanation. In manufacturing, firstly, a plurality of heat conduction tubes 5 are placed at the outer side of the heat dissipater 2, with each of the heat conduction tubes 5 disposed between the heat dissipation fins 21, and is pressed tightly on the heat dissipater 2 to form into heat connection. Then, one of its ends is connected to the fix seat 3 above the notch 22, while an elastic contact plate 4 is placed in front of the fix seat 3. Further, an electric circuit board 9 is first placed inside the protection box 1 made of iron, so that the high heat generating electronic element 91 are directly opposite to the notch 11 above the protection box 1, then it is connected to the heat dissipater 2. As such, the fix seat 3 extends in protrusion into the notch 11 of the protection box 1, to fully contact the high heat generating electronic element 91. And it utilizes the elastic contact plate 4 thereon to press against the surface of the high heat generating electronic element 91, to achieve tight contact and optimal heat conduction.

Figure 4:
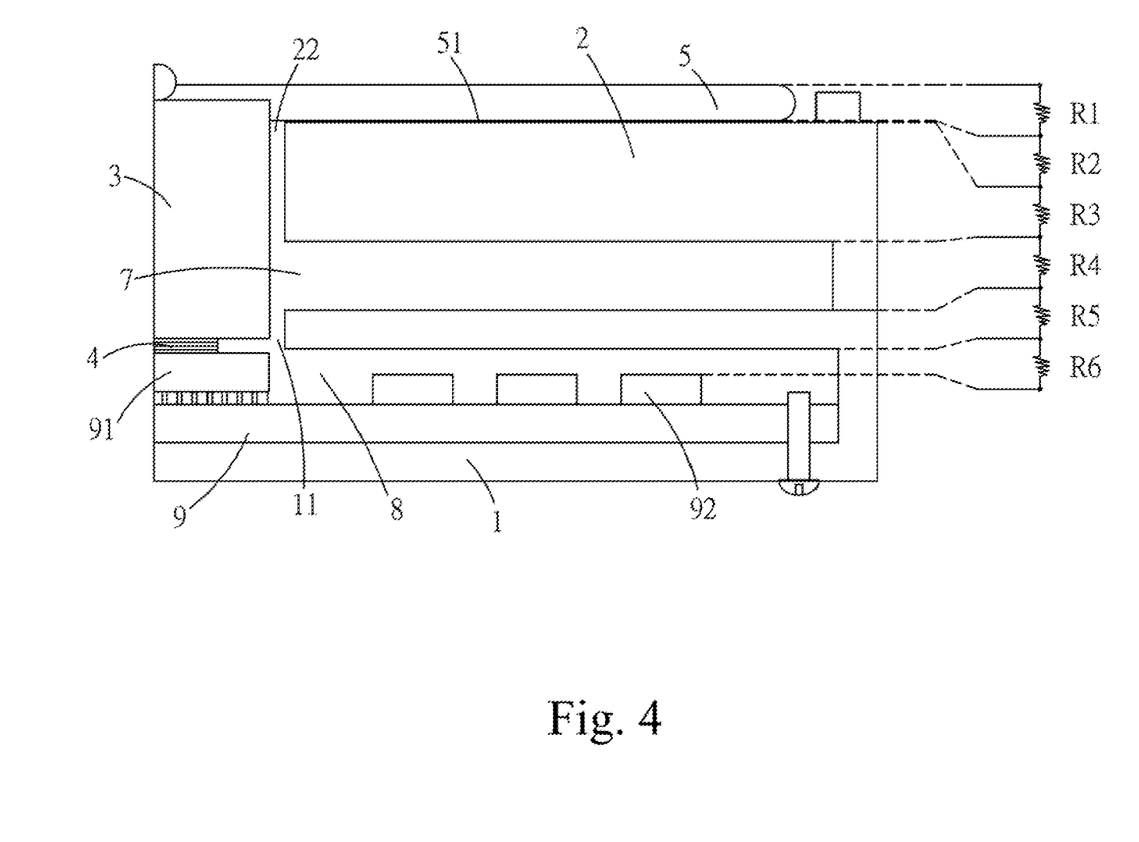
FIG. 4 is a schematic diagram showing multi-layer heat isolation between module and electronic circuit board for an enhanced heat dissipation module having multi-layer heat isolation according to the present invention.

In application, as shown in FIGS. 3 and 4, since the elastic contact plate 4 is disposed in front of the fix seat 3, to offset the assembly tolerance with elasticity, thus ensuring tight contact and low thermal resistance for the fix seat 3, the elastic contact plate 4, and the high heat generating electronic element 91. In this way, the high heat produced by the high heat generating electronic element 91 is transferred to the fix seat 3 through the elastic contact plate 4, then it reaches the entire heat dissipater 2 through the heat conduction tubes 5. As such, through heat dissipation by the large contact area and the heat convection between the heat dissipation fins 21 and the air, the high heat produced inside the protection box 1 is transferred to outside continuously, hereby reducing significantly the heat transferred to other parts of the protection box 1 as generated by the high heat generating electronic element 91.

In addition, for the structure formed by the heat conduction tubes 5, the heat dissipater 2, the inside air layer 7, the protection box 1, the inside air layer 8, and the electric circuit board 9, it basically constitutes a multi-layer conduction medium R1~R6, to enhance the heat isolation effect. Moreover, since all the upper parts of the protection box 1 except the notch 11 are tightly sealed, that could ensure heat isolation for the heat dissipater 2 of large contact area, and effectively deter the reflow of heat radiation from the heat dissipater 2. In this way, the protection box 1 can be kept at a reduced temperature for the electric circuit board 9 to work normally, while effectively prolonging the MTBF (Mean Time Between Failure) and MTTF (Mean Time To Failure) of the various electronic components 92.

In the present invention, the protection box 1 is so designed that, the backside of the electric circuit board 9 is supported evenly and sufficiently, thus being able to sustain more pressure. Meanwhile, an elastic contact plate 4 is used to reduce the stress on the electric circuit board 9, to prevent its deformation and contact gaps thus produced. As such, the enhanced heat dissipation module is able to ensure the integrity of solder tin for the various electronic components 92 SMDed on the electric circuit board 9, thus raising their reliability and MTBF (Mean Time Between Failure) and MTTF (Mean Time To Failure) significantly.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. An enhanced heat dissipation module having multi-layer heat isolation, comprising:
    a protection box, made of iron, and used to receive an electric circuit board, wherein on the protection box is provided with at least a notch corresponding to at least a high heat generating electronic component on the electric circuit board, while the high heat generating electronic component is one of following group consisting of: a central processing unit (CPU), an image processing chip, a graphic processing chip, and a high level integrated circuit (IC);
    a heat dissipater, which is an aluminum die casting piece, having a large heat dissipation area, disposed opposite to the protection box, and wherein the heat dissipater includes at least a fix seat disposed in protrusion on the heat dissipater, the fix seat is made of copper, and the fix seat extends into the notch of the protection box to contact fully a surface of the high heat generating electronic component;
    an elastic contact plate, made of copper and disposed in front of the fix seat, to press against the surface of the high heat generating electronic component; and
    a plurality of heat conduction tubes, each composed of a tight seal copper tube and each provided with volatile fluid inside, and pressed onto the heat dissipater, with its one end connected to the fix seat; such that
    through application of the enhanced heat dissipation module having multi-layer heat isolation, following advantages are achieved: tight contact and ensuing low thermal resistance, large contact area with air in achieving enhanced heat dissipation, multi-layer conduction medium and protection box in realizing heat isolation, and elastic metal support preventing deformation of an electric circuit board, in achieving increased reliability and service life of the electronic components on the electric circuit board,
    wherein each heat conduction tube is provided with heat conduction glue on its outer side, and is fixed onto an outer side of the heat dissipater with a lock plate.

2. The enhanced heat dissipation module having multi-layer heat isolation, as claimed in claim 1, wherein on the outer side of the heat dissipater is provided with heat dissipation fins, and on its opposite position is provided with a notch for receiving and installing the fix seat, while the heat conduction tubes are each disposed between the heat dissipation fins.

3. The enhanced heat dissipation module having multi-layer heat isolation, as claimed in claim 2, wherein the heat dissipater is in a form of a planar shape, or in a form of a shell of an undercut shape.

4. An enhanced heat dissipation module having multi-layer heat isolation, comprising:
    a protection box, made of iron, and used to receive an electric circuit board, wherein on the protection box is provided with at least a notch corresponding to at least a high heat generating electronic component on the electric circuit board, while the high heat generating electronic component is one of following group consisting of: a central processing unit (CPU), an image processing chip, a graphic processing chip, and a high level integrated circuit (IC);
    a heat dissipater, which is an aluminum die casting piece, having a large heat dissipation area, disposed opposite to the protection box, and wherein the heat dissipater includes at least a fix seat disposed in protrusion on the heat dissipater, the fix seat is made of copper, and the fix seat extends into the notch of the protection box to contact fully a surface of the high heat generating electronic component;
    an elastic contact plate, made of copper and disposed in front of the fix seat, to press against the surface of the high heat generating electronic component and
    a plurality of heat conduction tubes, each composed of a tight seal copper tube and each provided with volatile fluid inside, and pressed onto the heat dissipater, with its one end connected to the fix seat; such that
    through application of the enhanced heat dissipation module having multi-layer heat isolation, following advantages are achieved: tight contact and ensuing low thermal resistance, large contact area with air in achieving enhanced heat dissipation, multi-layer conduction medium and protection box in realizing heat isolation, and elastic metal support preventing deformation of an electric circuit board, in achieving increased reliability and service life of the electronic components on the electric circuit board, wherein each heat conduction tube is provided with heat conduction glue on its outer side, and is fixed to an inner side of the heat dissipater with a lock plate.

5. The enhanced heat dissipation module having multi-layer heat isolation, as claimed in claim 4, wherein an inner side of the heat dissipater is provided with a long slot, for installing the heat conduction tube.

6. The enhanced heat dissipation module having multi-layer heat isolation, as claimed in claim 5, wherein the heat dissipater is in a form of a planar shape, or in a form of a shell of an undercut shape.

\* \* \* \* \*